May 5, 1970 J. GREMILLET 3,510,806

INDUCTIVE REACTANCE CIRCUIT

Filed Nov. 30, 1965 2 Sheets-Sheet 1

Inventor
Jacques Gremillet
By Cushman, Darby & Cushman
Attorneys

May 5, 1970 J. GREMILLET 3,510,806

INDUCTIVE REACTANCE CIRCUIT

Filed Nov. 30, 1965 2 Sheets-Sheet 2

Inventor
Jacques Gremillet
By Cushman, Darby & Cushman
Attorneys

United States Patent Office 3,510,806

Patented May 5, 1970

3,510,806

INDUCTIVE REACTANCE CIRCUIT

Jacques Gremillet, Paris, France, assignor to CSF-Compagnie Generale de Telegraphie Sans Fil, a corporation of France Filed Nov. 30, 1965, Ser. No. 510,530

Claims priority, application France, Dec. 1, 1964, 996,940

Int. Cl. H03h 5/12

U.S. Cl. 333—80 4 Claims

ABSTRACT OF THE DISCLOSURE

An integrated inductive reactance circuit comprises an insulated gate field effect transistor, a capacitor and a resistor connected in series; the drain and the source are connected respectively to the terminals of a capacitor and a resistor connected in series; the gate is coupled between the resistor and the capacitor.

The present invention relates to integrated electric circuit elements. More particularly, it is an object of the invention to provide an integrated element adapted to fulfil the functions of reactance tube circuit.

Such a circuit is aimed at providing at the terminals of an active element, e.g. a triode, an apparent inductance which can be directly used for tuning a resonance circuit (comprising in the simplest case a resistor and a capacitor) with an active amplifying element suitably biased by means of decoupling circuits.

The applications for which the dimensions of the components must be reduced to the minimum become more and more numerous, which leads to a constant development of integrated circuits, that is to say, circuits in which the passive and active components are manufactured in the course of the same manufacturing procedure within or on the surface of a base which is usually a monocrystalline semiconductor but may also be of insulating material.

According to the present invention, there is provided an inductive reactance circuit comprising a first terminal, a resistor, a capacitor and a second terminal connected in series and an insulated gate field effect element comprising a gate coupled between said resistor and said capacitor, a drain coupled to said first terminal and a source coupled to said second terminal.

For a better understanding of the invention and to show how the same may be carried into effect reference will be made to the drawing accompanying the following description and in which.

Figure 1:
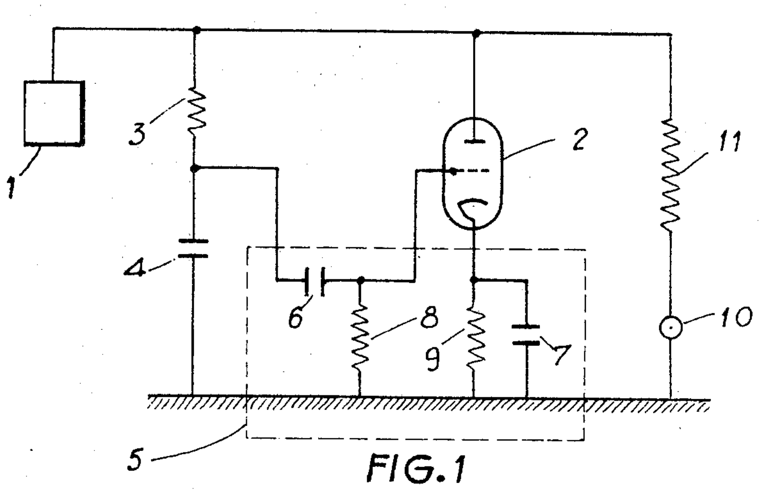
FIG. 1 is the circuit diagram of a conventional reactance tube.

FIG. 1 shows a conventional circuit comprising, in parallel with a resonance circuit 1 to be tuned, a circuit whose apparent reactance is inductive and which comprises a reactance tube 2 which is loaded by a resistor 3 and a capacitor 4. The assembly is equivalent to an induction coil with losses whose value depends on the transconductance of the tube.

The operating point of the tube is determined by the circuit 5 bounded in FIG. 1 by a dotted rectangle. Circuit 5 comprises decoupling capacitors 6 and 7 and resistors 8 and 9, which determine the D.C. potentials. The supply is shown at 10 and the load resistance at 11.

This known circuit cannot be integrated in the exact form described. In fact, on the one hand, the tube 2 is not an element capable of integration and on the other hand, the circuit 5, comprising two decoupling capacitors is difficult to build in integrated form according to known techniques.

It is an object of the present invention to avoid such difficulties.

According to the invention, the reactance tube 2 is replaced by a field effect element with insulated gate. As is well known, a field effect element comprises a semiconductor region called a channel in which flows a current of majority carriers between one electrode, called source, and a second electrode, called drain.

This current can be modulated by an electrode called the gate. In a field effect element with insulated gate, such as that used according to the invention, the current in the channel is modulated by the action of an electric field applied across a dielectric layer and the applied bias voltage can have the same sign as that of the anode relative to the cathode.

Figure 2:
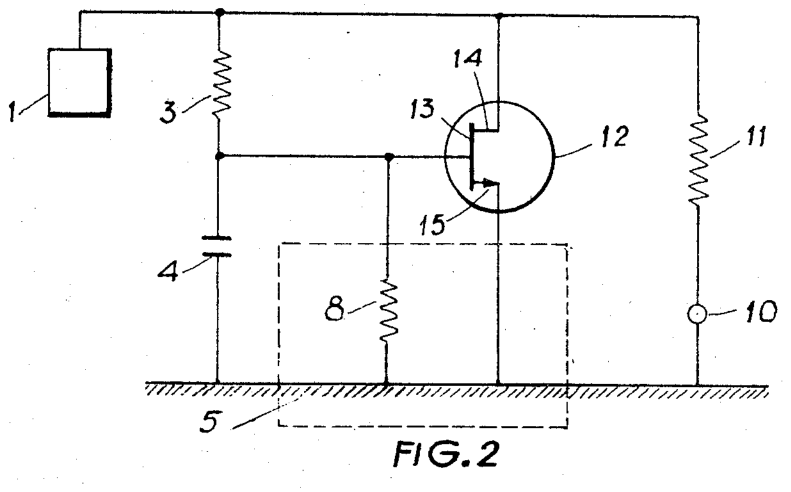
FIG. 2 is the equivalent diagram of an integrated circuit according to the invention.
Figure 6:
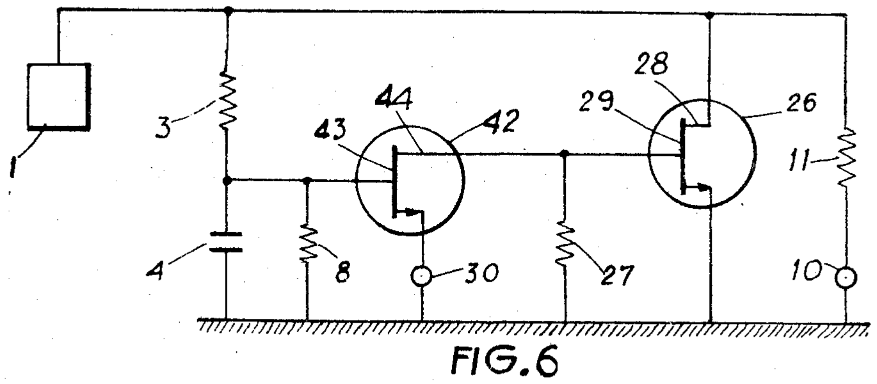
FIG. 6 is the equivalent circuit of a modification, particularly adapted to operate at high frequencies.

The use of this essential feature makes it possible to build up according to the invention a circuit as shown in FIG. 2, the operation of which is identical to that of the conventional circuit of FIG. 1 without requiring the use of the decoupling capacitors 6 and 7. It follows therefrom that the bias circuit 5 of the field effect element 12 is reduced to a single resistor 6 which simplifies the integration of the circuit considerably. In FIGS. 1 and 2 the same elements are designated by the same reference numerals.

The circuit to be tuned is shown at 1 and in its simplest form the dephasing circuit consists of the resistor 3 and the capacitor 4. The amplification is produced by an insulated gate field effect element 12. The gate 13 of this element is connected to the dephasing circuits 3 and 4 and is biased by means of the single resistor 8 in the absence of any decoupling capacitor. The source is shown at 15 and the drain 14 is connected to a supply 10 through the load resistor 11.

It appears from FIG. 2 that the circuit according to the invention can be integrated by resorting to known integrated circuit techniques.

Figure 4:
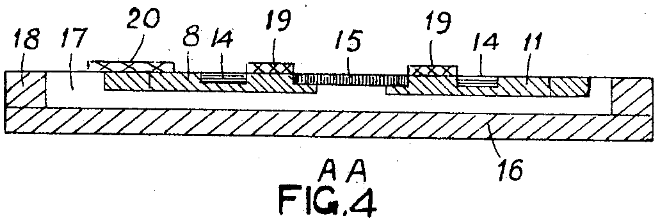
FIGS. 4 and 5 are sections of the device of FIG. 3 along lines A—A and B—B respectively.
Figures 3, 5:
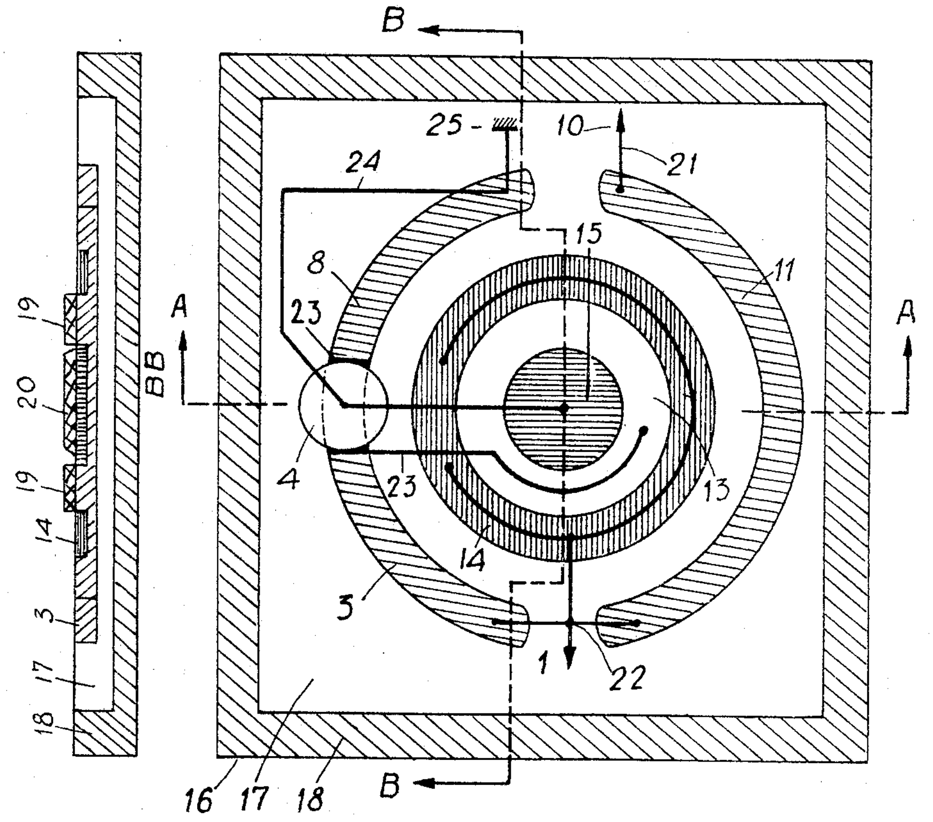
FIG. 3 shows in horizontal projection one embodiment of an integrated circuit according to the invention.

FIGS. 3 to 5 show by way of example one embodiment of the integrated circuit according to the invention.

It comprises a wafer or base 16 of n-type monocrystalline silicon on which is deposited by opitaxy p-type silicon 17. In the drawing all n-type zones are shaded. By resorting to well known masking techniques, which make it possible to define on the surface of the material privileged zones, in which a predetermined doping is to be effected by diffusion, to the exclusion of other regions, the following operations are carried out:

(a) N-type zones 18 are formed by diffusion on the p-type layer 16; such zones insulate the element from any neighboring elements.

(b) The resistors 11, 3 and 8 are obtained by diffusion of an impurity of n-type according to the selected profile.

(c) The drain 14, also of n-type, is formed.

(d) The n-type source 15 is formed.

(e) The gate 13 is formed by depositing a layer of oxide 19 which layer is metallized.

Finally, the capacitor 4 is formed by depositing locally on the resistors 3 and 8 a layer 20 of the same oxide $SiO_2$, which is also metallized.

The plate has thus been provided with all the active and passive elements required for its use according to the invention and defined above. In order to obtain the circuit as shown in FIG. 2 the necessary connections are made by metallization.

A connection 21 is established between the load resistor 11 and the supply 10. A connection 22 connects the drain to the load resistor 11, the resistor 3 and the alternating source 1. The gate control 23 is connected both to the resistor 3 and the resistor 8. Finally, the connection 24 is established between the source and earth and the capacitor and earth 25.

These connections are not shown in the cross-sections but only in the plan view.

This device is suitable for correct operation at low frequencies but at higher frequency values the possible existence of a parasitic capacitance between the drain and the grid may limit the good operation of the circuit.

A circuit as shown in FIG. 4 can overcome this drawback. It comprises two isolated gate field effect elements 42 and 26.

The circuit is similar to that of FIG. 2, except that the amplifier is formed by two field effect elements of which the first also acts as a separator. The parasitic capacitance which can exist between the drain and the gate of the field effect element 42 is in this case included in the capacitor 4. A second isolated gate field effect element 26 whose operating point is controlled by a resistor 27 assures the amplification with the desired phase. The drain 28 of the element 26 is coupled to the circuit to be tuned 1 on the one hand, and the supply 10 on the other hand through the load resistor 11. The gate 29 is connected to the drain 44 of the field effect element 42.

The supply of the field effect element 42 is shown at 30.

Of course the invention is not limited to the embodiments shown, which were given solely by way of example. More particularly, instead of using diffusion techniques for realizing the various elements such as resistors and capacitors, thin layer techniques may be used. In this case, the resistances can be formed, for example, by evaporating under vacuum of a film of tantallum.

Of course the invention is not limited to the embodiments described and shown which were given solely by way of example.

What is claimed is:

1. An inductive reactance circuit comprising a first terminal, a resistor, a capacitor and a second terminal connected in series and an insulated gate field effect element comprising a gate coupled between said resistor and said capacitor, a drain coupled to said first terminal and a source coupled to said second terminal.

2. A circuit as claimed in claim 1, wherein a second resistor connects said gate to said second terminal.

3. A circuit as claimed in claim 2, including a further insulated gate field effect element, including further gate, drain, and source, said further gate being connected between said resistor and capacitor, said further drain being connected to said gate and said further source being connected to said second terminal.

4. A circuit as claimed in claim 1, wherein said circuit is an integrated circuit.

References Cited

UNITED STATES PATENTS

| | | | |
|---|---|---|---|
| 3,160,835 | 12/1964 | Christensen | 333—80 |
| 3,343,003 | 9/1967 | Arseneau | 333—80 |
| 3,255,364 | 6/1966 | Warner | 333—80 |
| 3,289,118 | 10/1966 | Garstang | 333—80 |
| 2,981,877 | 4/1961 | Noyce | 317—235 |
| 2,929,999 | 3/1960 | Bradley | 330—38 |
| 3,152,309 | 10/1964 | Bogusz et al. | 333—10 |

HERMAN KARL SAALBACH, Primary Examiner

C. BARAFF, Assistant Examiner

U.S. Cl. X.R.

307—304; 317—235; 330—38